United States Patent
Yu et al.

(10) Patent No.: US 8,823,270 B2
(45) Date of Patent: Sep. 2, 2014

(54) INTERCHANGEABLE LED BULBS

(75) Inventors: Jing Jing Yu, El Monte, CA (US); Shengwang Du, Hong Kong (HK)

(73) Assignee: 1 Energy Solutions, Inc., Agoura Hills, CA (US)

( * ) Notice: Subject to any disclaimer, the term of this patent is extended or adjusted under 35 U.S.C. 154(b) by 275 days.

(21) Appl. No.: 13/213,247

(22) Filed: Aug. 19, 2011

(65) Prior Publication Data

US 2012/0217896 A1    Aug. 30, 2012

Related U.S. Application Data (60) Division of application No. 12/098,423, filed on Apr. 5, 2008, now Pat. No. 8,016,440, which is a continuation-in-part of application No. 11/056,148, filed on Feb. 14, 2005, now abandoned.

(51) Int. Cl.
*H05B 39/00* (2006.01)

(52) U.S. Cl.
USPC ............ 315/185 S; 315/247; 315/209 R; 315/312

(58) Field of Classification Search
USPC ............ 315/185 S, 247, 209 R, 312–326
See application file for complete search history.

(56) References Cited

U.S. PATENT DOCUMENTS

| | | |
|---|---|---|
| 1,694,997 A | 12/1928 | VanHorn |
| 3,425,027 A | 1/1969 | Uberbacher |
| 3,519,913 A | 7/1970 | Janecek |
| 3,593,038 A | 7/1971 | Hylten-Cavallius |
| 3,639,822 A | 2/1972 | Brown |
| 3,758,771 A | 9/1973 | Frohardt |
| 4,035,681 A | 7/1977 | Savage |
| 4,074,165 A | 2/1978 | Moriyama |
| 4,223,248 A | 9/1980 | Tong |
| 4,298,869 A | 11/1981 | Okuno |
| 4,316,125 A | 2/1982 | Noguchi |
| 4,321,598 A | 3/1982 | Warner |
| 4,329,625 A | 5/1982 | Nishizawa |
| 4,348,663 A | 9/1982 | Yanagishima |
| 4,365,244 A | 12/1982 | Gillessen |

(Continued)

FOREIGN PATENT DOCUMENTS

CA    2342321    3/2000

OTHER PUBLICATIONS

U.S. Appl. No. 12/542,903, filed Aug. 18, 2009, by Beijing Yu.

(Continued)

*Primary Examiner* — Tuyet Thi Vo
(74) *Attorney, Agent, or Firm* — William W. Cochran; Cochran Freund & Young LLC (57) ABSTRACT

Disclosed are circuits that allow LED bulbs to be replaced regardless of color or construction of the LED element. When used for an LED light string, replacing an LED bulb does not affect the operation of the entire string. When used for other illumination purpose, for example, room light, the bulbs are interchangeable because they have the same operating voltage and current. A standardized input impedance is selected for all of the LED bulbs regardless of construction and color. A resistor circuit is used to create the standardized input impedance while optimizing the operating parameters of the LED element. The resistor circuit includes a bypass element so that if a LED element burns open, a series wired LED string will not go dark. This eliminates the necessity for parallel connected LED bulbs and allows enjoyment of other advantages and economies of series wired LED strings.

22 Claims, 3 Drawing Sheets

(56) References Cited

U.S. PATENT DOCUMENTS

| | | |
|---|---|---|
| 4,367,471 A | 1/1983 | Gillessen |
| 4,396,823 A | 8/1983 | Nihei |
| 4,492,952 A | 1/1985 | Miller |
| 4,521,835 A | 6/1985 | Meggs |
| 4,528,619 A | 7/1985 | Dolan |
| 4,595,920 A | 6/1986 | Runyan |
| 4,652,981 A | 3/1987 | Glynn |
| 4,675,575 A | 6/1987 | Smith |
| 4,727,603 A | 3/1988 | Howard |
| 4,728,849 A | 3/1988 | Morris et al. |
| 4,807,098 A | 2/1989 | Ahroni |
| 4,839,777 A | 6/1989 | Janko |
| 4,843,280 A | 6/1989 | Lumbard |
| 4,857,920 A | 8/1989 | Kataoka |
| 4,954,822 A | 9/1990 | Borenstein |
| 4,959,766 A | 9/1990 | Jain |
| 4,967,330 A | 10/1990 | Bell et al. |
| 5,087,212 A | 2/1992 | Hanami |
| 5,130,897 A | 7/1992 | Kuzma |
| 5,155,669 A | 10/1992 | Yamuro |
| 5,187,377 A | 2/1993 | Katoh |
| 5,193,895 A | 3/1993 | Naruke |
| 5,239,872 A | 8/1993 | Meyer-Bisch |
| 5,257,020 A | 10/1993 | Morse |
| 5,313,187 A | 5/1994 | Choi |
| 5,321,593 A | 6/1994 | Moates |
| 5,323,305 A | 6/1994 | Ikeda |
| 5,366,780 A | 11/1994 | Rapisarda |
| 5,368,503 A | 11/1994 | Savage |
| 5,404,282 A | 4/1995 | Klinke |
| 5,410,458 A | 4/1995 | Bell |
| 5,436,809 A | 7/1995 | Brassier |
| 5,457,450 A | 10/1995 | Deese |
| 5,463,280 A | 10/1995 | Johnson |
| 5,481,444 A | 1/1996 | Schultz |
| 5,499,174 A | 3/1996 | Lin |
| 5,504,514 A | 4/1996 | Nelson |
| 5,528,484 A | 6/1996 | Hayashi |
| 5,567,037 A | 10/1996 | Ferber |
| 5,580,156 A | 12/1996 | Suzuki et al. |
| 5,580,159 A | 12/1996 | Liu |
| 5,588,863 A | 12/1996 | Wu |
| 5,634,711 A | 6/1997 | Kennedy et al. |
| 5,647,759 A | 7/1997 | Lien |
| 5,649,755 A | 7/1997 | Rapisarda |
| 5,655,830 A | 8/1997 | Ruskouski |
| 5,660,560 A | 8/1997 | Chong |
| 5,663,719 A | 9/1997 | Deese |
| 5,670,847 A | 9/1997 | Lin |
| 5,672,000 A | 9/1997 | Lin |
| 5,681,107 A | 10/1997 | Wang |
| 5,688,042 A | 11/1997 | Madadi et al. |
| 5,718,502 A | 2/1998 | Tseng |
| 5,720,544 A | 2/1998 | Shu |
| 5,722,860 A | 3/1998 | Pan |
| 5,726,535 A | 3/1998 | Yan |
| 5,762,419 A | 6/1998 | Yan |
| 5,777,868 A | 7/1998 | Gibboney, Jr. |
| 5,806,965 A | 9/1998 | Deese |
| 5,808,592 A | 9/1998 | Mizutani |
| 5,887,967 A | 3/1999 | Chang |
| 5,890,794 A | 4/1999 | Abtahi |
| 5,936,599 A | 8/1999 | Raymond |
| 5,941,626 A | 8/1999 | Yamuro |
| 5,962,971 A | 10/1999 | Chen |
| 5,969,469 A | 10/1999 | Wang |
| 5,988,831 A | 11/1999 | Pan |
| 6,022,241 A | 2/2000 | Lin |
| 6,048,074 A | 4/2000 | Wang |
| 6,072,280 A | 6/2000 | Allen |
| 6,079,848 A | 6/2000 | Ahroni |
| 6,120,312 A | 9/2000 | Shu |
| 6,183,104 B1 | 2/2001 | Ferrara |
| 6,183,310 B1 | 2/2001 | Shu |
| 6,190,021 B1 | 2/2001 | Huang |
| 6,194,839 B1 | 2/2001 | Chang |
| 6,200,003 B1 | 3/2001 | Tseng |
| 6,220,722 B1 | 4/2001 | Begemann |
| 6,227,679 B1 | 5/2001 | Zhang |
| 6,234,649 B1 | 5/2001 | Katougi |
| 6,283,797 B1 | 9/2001 | Wu |
| 6,361,192 B1 | 3/2002 | Fussell et al. |
| 6,361,198 B1 | 3/2002 | Reed |
| 6,367,952 B1 | 4/2002 | Gibboney |
| 6,382,812 B1 | 5/2002 | Hsu |
| 6,461,019 B1 | 10/2002 | Allen |
| 6,478,455 B2 | 11/2002 | Ahroni |
| 6,489,728 B2 | 12/2002 | Guthrie et al. |
| 6,505,954 B2 | 1/2003 | Chen |
| 6,550,953 B1 | 4/2003 | Ichikawa |
| D474,848 S | 5/2003 | Lodhie |
| D474,849 S | 5/2003 | Lodhie |
| 6,565,244 B1 | 5/2003 | Murphy et al. |
| 6,598,996 B1 | 7/2003 | Lodhie |
| 6,648,495 B1 | 11/2003 | Hsu |
| 6,659,632 B2 | 12/2003 | Chen |
| 6,659,932 B2 | 12/2003 | Campbell, Jr. et al. |
| D485,379 S | 1/2004 | Steklenburg |
| 6,709,132 B2 | 3/2004 | Ishibashi |
| 6,717,526 B2 | 4/2004 | Martineau |
| 6,739,733 B1 | 5/2004 | Lamke et al. |
| 6,758,578 B1 | 7/2004 | Chou |
| 6,796,688 B2 | 9/2004 | Huang |
| 6,830,358 B2 | 12/2004 | Allen |
| 6,869,313 B2 | 3/2005 | Gibboney, Jr. |
| 7,012,379 B1 | 3/2006 | Chambers et al. |
| 7,014,352 B2 | 3/2006 | Wu |
| 7,045,965 B2 | 5/2006 | Yu |
| 7,063,442 B2 | 6/2006 | Sugar |
| 7,066,628 B2 | 6/2006 | Allen |
| 7,066,636 B2 | 6/2006 | Wu |
| 7,086,756 B2 | 8/2006 | Maxik |
| 7,118,249 B2 | 10/2006 | Hsu et al. |
| 7,172,314 B2 | 2/2007 | Currie et al. |
| 7,217,005 B2 | 5/2007 | Lin |
| 7,220,022 B2 | 5/2007 | Allen et al. |
| 7,250,730 B1 | 7/2007 | Allen |
| 7,276,858 B2 | 10/2007 | Allen |
| 7,344,275 B2 | 3/2008 | Allen et al. |
| 7,350,936 B2 | 4/2008 | Ducharme et al. |
| 7,377,802 B2 | 5/2008 | Allen |
| 7,396,142 B2 | 7/2008 | Laizure, Jr. et al. |
| 7,488,094 B2 | 2/2009 | Murayama et al. |
| 7,518,316 B2 | 4/2009 | Yu |
| 7,575,362 B1 | 8/2009 | Hsu |
| 7,661,852 B2 | 2/2010 | Yu |
| 7,784,993 B2 | 8/2010 | Yu |
| 7,794,124 B2 | 9/2010 | Hulsey et al. |
| 7,850,361 B2 | 12/2010 | Yu |
| 7,850,362 B2 | 12/2010 | Yu |
| 7,852,011 B2 | 12/2010 | Peng |
| 7,883,261 B2 | 2/2011 | Yu |
| 7,963,670 B2 | 6/2011 | Yu |
| 8,016,440 B2 | 9/2011 | Yu et al. |
| 8,083,393 B2 | 12/2011 | Yu |
| 2002/0043943 A1 | 4/2002 | Menzer et al. |
| 2002/0097586 A1 | 7/2002 | Horowitz |
| 2002/0105438 A1 | 8/2002 | Forbes |
| 2003/0025120 A1 | 2/2003 | Chang |
| 2003/0079387 A1 | 5/2003 | Derose |
| 2003/0147245 A1 | 8/2003 | Chen |
| 2003/0198048 A1 | 10/2003 | Frederick |
| 2004/0042205 A1 | 3/2004 | Tanabe et al. |
| 2004/0114367 A1 | 6/2004 | Li |
| 2004/0135522 A1 | 7/2004 | Berman |
| 2004/0140892 A1 | 7/2004 | Hanood |
| 2004/0184270 A1 | 9/2004 | Halter |
| 2004/0190289 A1 | 9/2004 | Liu |
| 2004/0190290 A1 | 9/2004 | Zerphy et al. |
| 2004/0233145 A1 | 11/2004 | Chiang |
| 2005/0047729 A1 | 3/2005 | Vilgiate |
| 2005/0057187 A1 | 3/2005 | Catalano |
| 2005/0162851 A1 | 7/2005 | Kazar et al. |
| 2005/0174769 A1 | 8/2005 | Yong et al. |

(56) References Cited

U.S. PATENT DOCUMENTS

| | | |
|---|---|---|
| 2005/0213324 A1 | 9/2005 | Chen |
| 2006/0007679 A1 | 1/2006 | Allen |
| 2006/0012349 A1 | 1/2006 | Allen |
| 2006/0012997 A1 | 1/2006 | Catalano |
| 2006/0028194 A1 | 2/2006 | Bosch |
| 2006/0044788 A1 | 3/2006 | Damrau |
| 2006/0098442 A1 | 5/2006 | Yu |
| 2006/0180822 A1 | 8/2006 | Yu |
| 2006/0181884 A1 | 8/2006 | Li |
| 2006/0203482 A1 | 9/2006 | Allen |
| 2006/0256585 A1 | 11/2006 | Pan |
| 2006/0270250 A1 | 11/2006 | Allen |
| 2006/0291256 A1 | 12/2006 | Cobbler |
| 2007/0025109 A1 | 2/2007 | Yu |
| 2007/0064450 A1 | 3/2007 | Chiba et al. |
| 2007/0183153 A1 | 8/2007 | Yu |
| 2007/0241357 A1 | 10/2007 | Yan |
| 2008/0024071 A1 | 1/2008 | Yu |
| 2008/0025024 A1 | 1/2008 | Yu |
| 2008/0094857 A1 | 4/2008 | Smith et al. |
| 2008/0143234 A1 | 6/2008 | Yu |
| 2008/0157686 A1 | 7/2008 | Chung et al. |
| 2008/0186704 A1 | 8/2008 | Chou et al. |
| 2008/0258649 A1 | 10/2008 | Yu |
| 2008/0285279 A1 | 11/2008 | Ng et al. |
| 2009/0027903 A1 | 1/2009 | Yu |
| 2009/0059565 A1 | 3/2009 | Bertram |
| 2009/0116236 A1 | 5/2009 | Chiang |
| 2009/0213602 A1 | 8/2009 | Gallegos |
| 2010/0067222 A1 | 3/2010 | Yu |
| 2010/0073963 A1 | 3/2010 | Yu |
| 2010/0109560 A1 | 5/2010 | Yu |
| 2010/0264806 A1 | 10/2010 | Yu |

OTHER PUBLICATIONS

Chinese Patent Application No. 200920172743.1 filed Apr. 20, 2009 by Jing Jing Yu.
U.S. Appl. No. 09/339,616; Inventor: Tuyet Thi Vo; abandoned.
U.S. Appl. No. 09/378,631, Inventor: Tuyet Thi Vo; abandoned.
U.S. Appl. No. 11/716,788, filed Mar. 12, 2007, by Jing Jing Yu.
U.S. Appl. No. 12/098,423, filed Apr. 5, 2008, by Jing Jing Yu.
U.S. Appl. No. 61/043,262, filed Apr. 8, 2008, by Jing Jing Yu.
U.S. Appl. No. 60/949,804, filed Jul. 13, 2007, by Jing Jing Yu.
Non-Final Office Action mailed Feb. 15, 2007, in U.S. Appl. No. 11/056,148, filed Feb. 14, 2005, by Jing Jing Yu.
U.S. Appl. No. 12/431,098, filed Apr. 28, 2009, by Jing Jing Yu.
Non-Final Office Action mailed Oct. 15, 2010, in U.S. Appl. No. 12/098,423, filed Apr. 5, 2008, by Jing Jing Yu.
U.S. Appl. No. 11/350,343, filed Feb. 9, 2006, by Jing Jing Yu.
U.S. Appl. No. 12/610,117, filed Oct. 30, 2009, by Jing Jing Yu.
U.S. Appl. No. 11/957,294, filed Dec. 14, 2007, by Jing Jing Yu.

INTERCHANGEABLE LED BULBS

CROSS-REFERENCE TO RELATED APPLICATION

This application is a divisional application of U.S. patent application Ser. No. 12/098,423, entitled "Interchangeable LED Bulbs," by Jing Jing Yu and Shengwang Du, filed Apr. 5, 2008, which application is a continuation-in-part of U.S. patent application Ser. No. 11/056,148, entitled "Interchangeable LED Bulbs and Light String Assembly Therewith," by Jing Jing Yu, filed Feb. 14, 2005. The entire contents of the above mentioned applications are hereby specifically incorporated herein by reference for all that they disclose and teach.

BACKGROUND OF THE INVENTION

LEDs have increasingly been used as luminance sources in various applications. In addition to other desirable features, the availability of LEDs in a wide variety of colors makes these LEDs very attractive and suitable for decoration and general illumination purposes. As a result, one application where LEDs have become particularly popular in recent years is decorative light strings. Such light strings are usually formed from a plurality of LEDs connected in series or parallel, or some combination thereof, with different colored LEDs.

SUMMARY OF THE INVENTION

An embodiment of the present invention may comprise a method of making an interchangeable LED bulb that can be interchangeably used in an LED light string without affecting performance of the light string comprising: selecting a standardized input impedance ($R_{in}$) for the interchangeable LED bulb by determining an input voltage ($V_{in}$) and an input current ($I_{in}$) to be applied to the interchangeable LED bulb when the interchangeable LED bulb is inserted in the light string; determining an operating current ($I_{LED}$) and an operating voltage ($V_{LED}$) for an LED element of the interchangeable LED bulb; determining an input impedance ($R_{LED}$) of the LED element from: $R_{LED}=V_{LED}/I_{LED}$; connecting a first resistor in series with the LED element; connecting a second resistor in parallel with the first resistor and the LED element; selecting a resistive value for the first resistor ($R_1$) that is substantially equal to ($V_{in}-V_{LED}$)/$I_{LED}$; selecting a resistive value for the second resistor ($R_2$) that is substantially equal to $V_{in}/(I_{in}-I_{LED})$.

An embodiment of the present invention may further comprise a method of making an interchangeable LED bulb that can be interchangeably used in an LED light string without affecting performance of the light string comprising: selecting a standardized input impedance ($R_{in}$) for the interchangeable LED bulb by determining an input voltage ($V_{in}$) and an input current ($I_{in}$) to be applied to the interchangeable LED bulb when the interchangeable LED bulb is inserted in the light string; determining an operating current ($I_{LED}$) and an operating voltage ($V_{LED}$) for an LED element of the interchangeable LED bulb; determining an input impedance ($R_{LED}$) of the LED element that is equal to $V_{LED}/I_{LED}$; connecting a second resistor ($R_2$) in parallel with the LED element; connecting a first resistor ($R_1$) in series with the second resistor ($R_2$) and the LED element; selecting a resistive value for the first resistor ($R_1$) that is substantially equal to ($V_{in}-V_{LED}$)/$I_{in}$; selecting a resistive value for the second resistor ($R_2$) that is substantially equal to $V_{LED}/(I_{in}-I_{LED})$.

An embodiment of the present invention may further comprise an interchangeable LED bulb having a standardized input impedance ($R_{in}$) that is based upon a pre-selected input current ($I_{in}$) and a pre-selected input voltage ($V_{in}$) applied to the bulb that is disposed in a light string comprising: an LED element having an operating voltage $V_{LED}$ and an operating current $I_{LED}$; a first resistor ($R_1$) that is connected in series with the LED element having a resistive value that is approximately equal to ($V_{in}-V_{LED}$)/$I_{LED}$; a second resistor ($R_2$) that is connected in parallel with the first resistor ($R_1$) and the LED element having a resistive value that is approximately equal to $V_{in}/(I_{in}-I_{LED})$.

An embodiment of the present invention may further comprise an interchangeable LED bulb having a standardized input impedance ($R_{in}$) that is based upon a pre-selected input current ($I_{in}$) and a pre-selected input voltage ($V_{in}$) applied to the bulb that is disposed in a light string comprising: an LED element having an operating voltage $V_{LED}$ and an operating current $I_{LED}$; a second resistor ($R_2$) that is connected in parallel with the LED element having a resistive value that is approximately equal to $V_{LED}/(I_{in}-I_{LED})$; a first resistor ($R_1$) that is connected in series with the second resistor ($R_2$) and the LED element having a resistive value that is approximately equal to ($V_{in}-V_{LED}$)/$I_n$.

DETAILED DESCRIPTION OF THE EMBODIMENTS

Figure 1:
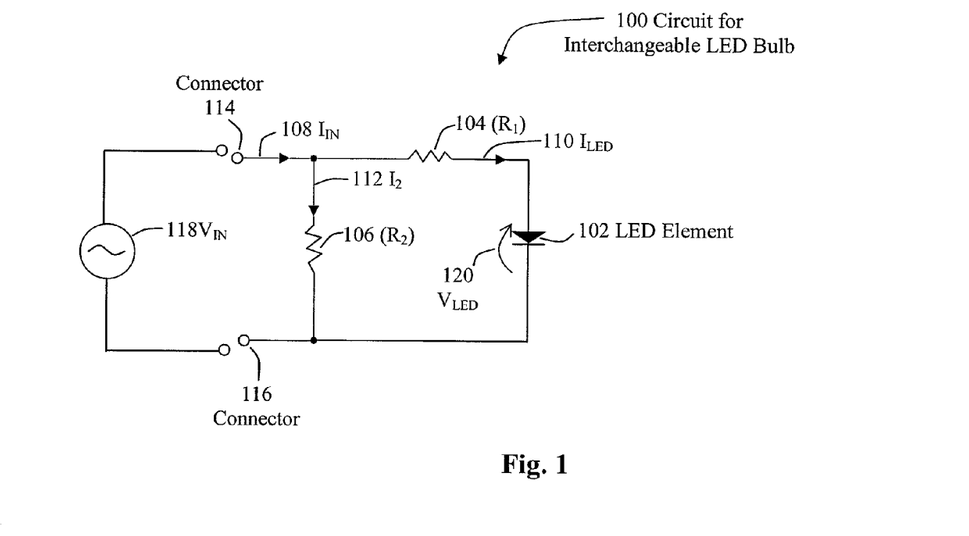
FIG. 1 is a schematic diagram of one embodiment of a circuit for an interchangeable LED bulb.

FIG. 1 illustrates one embodiment of a circuit 100 for an interchangeable LED bulb. LED bulbs have been used in many different applications, including decorative light strings. In some LED light strings, all of the LED bulbs are fixed in the string and are not replaceable. For example, U.S. Pat. No. 6,830,358, which is specifically incorporated herein by reference for all that it discloses and teaches, discloses a light string in which the LED bulbs are connected in series. If one of the LED bulbs burns open or is disconnected, the entire light string turns dark. In that case, the entire light string will no longer operate. If the LED bulbs are replaceable in the light string, the burned out bulb can be replaced. However, this is a time consuming task to identify the faulty bulb since the entire string is dark. If the light string is wired in a series-parallel configuration, such as disclosed in U.S. Pat. No. 7,045,965, U.S. application Ser. No. 11/461,293, entitled "Parallel-Series LED Light String," filed by Jing Jing Yu on Jul. 31, 2006, and U.S. application Ser. No. 11/831,929, entitled "Bypass Components in a Series Wired LED Light String," filed by Jing Jing Yu, Jul. 31, 2007, which are specifically incorporated herein by reference for all that they disclose and teach, a failed LED does not cause failure of the entire light string since a parallel LED provides a current path for the remaining LEDs in the light string. However, the failed LED changes the current through the parallel LED, and the brightness of the remaining LEDs in the string changes. The LEDs in the string become dimmer because the load of the entire string increases. This is because the resistance of the single parallel LED is approximately half of the resistance of the two LEDs in parallel. Hence, it is desirable to use replaceable or interchangeable bulbs in LED string, rather than relying upon the use of parallel LED bulbs that will cause the light string to be dimmer if one of the parallel bulbs burns out. Further, the parallel LED passes higher current than its normal operating current, and as such, the lifetime of the parallel LED is shortened.

The circuit illustrated in FIG. 1 includes an LED element 102 that generates visible light at specified frequencies depending upon the construction and materials used to form the LED element 102. For example, the LED element 102 can be constructed to produce different colors, such as red, green, blue, yellow, etc., depending upon the materials used in the construction of the LED element. However, the operating parameters of LED elements, such as LED element 102, vary in accordance with their ability to generate different spectral frequencies of light. For example, an LED element that emits red light may draw less current than an LED element that emits blue light. Further, individual LED elements that emit the same spectral frequency may also draw different currents as a result of variations in size and construction. Hence, the operating parameters of LED elements vary, especially LED elements that emit different color light.

An LED light string, that uses replaceable or interchangeable bulbs, allows the user to separately purchase and replace the bulb. If a bulb is broken or burned out, it can be replaced with a new one. Moreover, the user can customize a light string pattern by replacing bulbs with different colors. As set forth above, LEDs that are different colors are made of different semiconductor materials that have different electrical characteristics. Replacement of an LED bulb with an LED bulb of a different color will usually change the load on the string which will either cause the string to dim and shine less brightly or shine too brightly and shorten the life the LEDs on the string. Further, since individual LED elements can vary even though they produce the same wavelength of light, replacement of bulbs in a series string or a parallel-series string can adversely affect the operation of the string.

The circuit 100, illustrated in FIG. 1, for an interchangeable light bulb, provides a standardized interface that has predetermined input operating parameters of voltage ($V_{in}$) and current ($I_{in}$) for each LED bulb so that LED bulbs may be used interchangeably. As shown in FIG. 1, an LED element 102 is connected in series to a first resistor 104 ($R_1$). A second resistor 106 ($R_2$) is connected in parallel to the first resistor 104 ($R_1$) and the LED 102. A first electrical connector 114 and a second electrical connector 116 are wired to a voltage source $V_{in}$ 118. The electrical properties of such an interchangeable LED bulb can be fully characterized by its operating input voltage $V_{in}$ and operating input current $I_{in}$ which is pre-selected, and made the same for all LED bulbs, regardless of the color or other factors that affect the bulb, by adjusting the values of the resistors, as disclosed more fully below. Hence, even though different LED elements may have different operating voltages ($V_{LED}$) 120 and currents ($I_{LED}$) 110, the two resistors 104, 106 are used to adjust for these differences and provide a standardized input interface.

By knowing the predetermined operating input voltage $V_{in}$ and operating input current $I_{in}$ of LED bulb 100 in a light string, the input load or input impedance ($R_{in}$) of circuit 100 can be calculated as:

$$R_{in} = \frac{V_{in}}{I_{in}} \qquad (1)$$

which is the value that is standardized and made the same for all of the LED bulbs. Both $V_{in}$ and $I_{in}$ can be selected for the bulbs in the light string by adjusting the size of a series resistor (not shown) that is also disposed in the light string, based upon the number of bulbs in the string and how the bulbs are connected in the string. The optimal LED operating voltage ($V_{LED}$) 120 and optimal operating input current ($I_{LED}$) 110 for each LED element in each LED bulb can be measured, or approximated, and will be known. Knowing $V_{LED}$ 120 and $I_{LED}$ 110, effective load or impedance of the LED element 102 can be calculated as:

$$R_{LED} = \frac{V_{LED}}{I_{LED}}. \qquad (2)$$

Then the values of resistors 104 ($R_1$), 106 ($R_2$) are determined by the following equations:

$$R_{in} = \frac{(R_1 + R_{LED})R_2}{R_1 + R_{LED} + R_2} \qquad (3)$$

where $R_{in}$ is the input impedance of circuit 100, $$\text{and } (I_{in}-I_{LED})R_2 = I_{LED}(R_1+R_{LED}). \qquad (4)$$

Solving the above equations (1-4), $$R_1 = \frac{V_{in} - V_{LED}}{I_{LED}} \text{ and} \qquad (5)$$

$$R_2 = \frac{V_{in}}{I_{in} - I_{LED}} \qquad (6)$$

Equations (5) and (6) require that $V_{in} \geq V_{LED}$ and $I_{in} \geq I_{LED}$. $R_1$ can be zero when $V_{in}=V_{LED}$. $R_2$ can be infinite when $I_{in}=I_{LED}$.

By standardizing and making the input impedance $R_{in}$ the same for each LED bulb 200 (FIG. 2) that is in an LED string, LED bulbs can be interchangeably inserted in sockets in the LED string without affecting the operation of the LED string. Hence, bulbs of different colors and types can be used interchangeably without causing the LED string to either dim or cause LED bulbs in the LED string to have a shortened lifetime. Again, a series connected resistor in the LED string can make up the differences in the voltage drop required on the string based upon the number of LED bulbs in the string and the manner in which the LED bulbs are connected to the string.

The compatible, standardized electrical interface can also be used on LED bulbs that are not part of a light string, so as to provide compatibility and interchangeability of LED bulbs. This would allow LEDs that have different optical-electrical properties to be fully interchangeable. As indicated above, an LED bulb is characterized by its operating input voltage ($V_{in}$) and input current ($I_{in}$). For a given desired brightness, an LED is characterized by its operating voltage ($V_{LED}$) and operating current ($I_{LED}$). A standardized input voltage ($V_{in}$) and input current ($I_{in}$), i.e. input impedance, can be selected for LED bulbs, so that the bulbs have the same operating parameters. In this fashion, any type of arrangement of LED elements, or different types of LED elements, can be used while still allowing for full compatibility.

Figure 2:
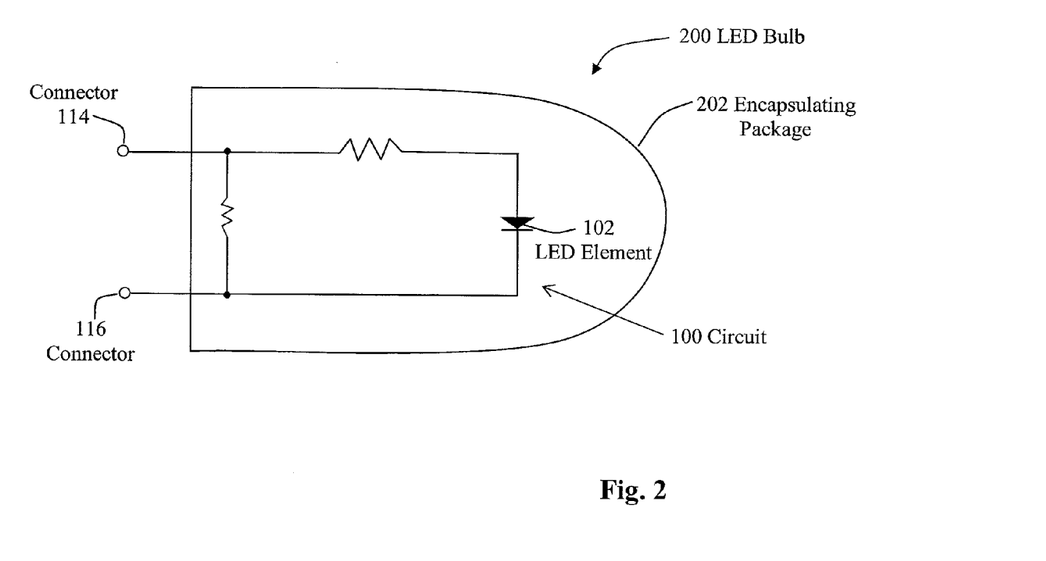
FIG. 2 is an illustration of the circuit of FIG. 1 disposed in an encapsulating package.

FIG. 2 is an illustration of an LED bulb 200. As shown in FIG. 2, the circuit 100, illustrated in FIG. 1, is disposed in an encapsulating package 202 to form the LED bulb 200. Connectors 114, 116 protrude from the end of the encapsulating package 202 for connection to an LED string, such as an LED string that includes a holder for replaceable bulbs as disclosed in U.S. application Ser. No. 12/020,373, entitled "Removable LED Lamp Holder," filed by Jing Jing Yu on Jan. 25, 2008, which is specifically incorporated herein by reference for all that it discloses and teaches. Connectors 114, 116 may comprise leads of the LED bulb 200. The encapsulating package 202 may be formed of an epoxy resin or other material that is capable of holding the circuit 100 and allowing light to be transmitted from the LED element 102. Hence, the encapsulating package 202 is at least semitransparent to allow light to be emitted from the LED element 102.

Figure 3:
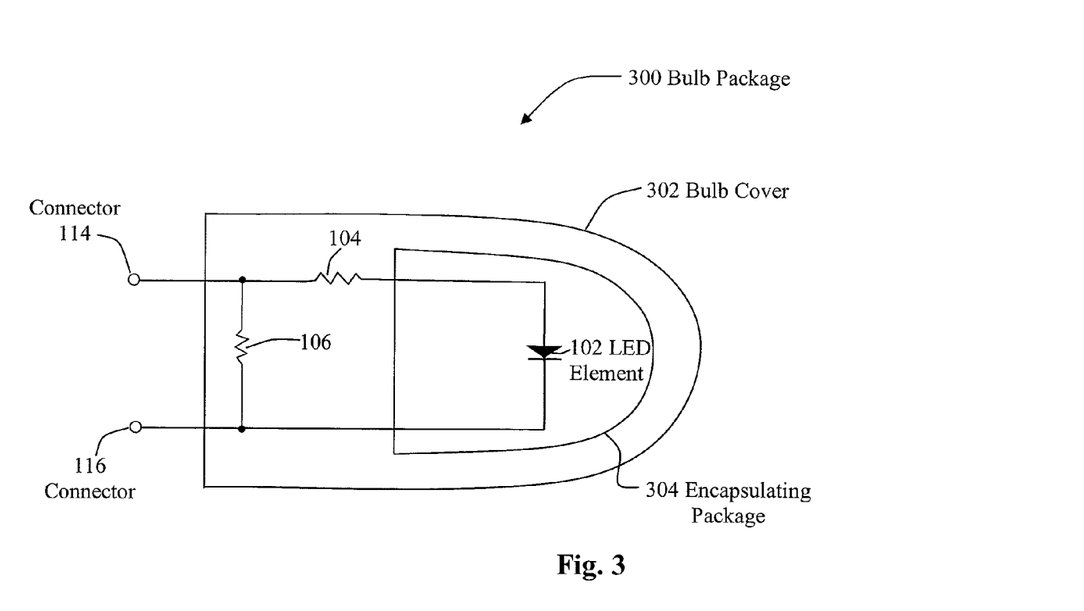
FIG. 3 is an illustration of the circuit of FIG. 1 showing an alternative packaging configuration.

FIG. 3 discloses another embodiment of an encapsulating package 300. As shown in FIG. 3, the LED element 102 is enclosed within the encapsulating package 304. A bulb cover 302 encloses both the encapsulating package 304 as well as resistors 104, 106. Connectors 114, 116 protrude from the end of the bulb cover 302 and may comprise LED leads. In this manner, LED elements 102 that are prepackaged in an encapsulating package 304 can be connected to the remaining portion of the circuit 100 comprising resistors 104, 106 and subsequently packaged in a bulb cover 302. Hence, LED elements, such as LED element 102 that is prepackaged in an encapsulating package 304, can still be connected to a circuit to standardize the input impedance of the bulb illustrated in FIG. 3.

Figure 4:
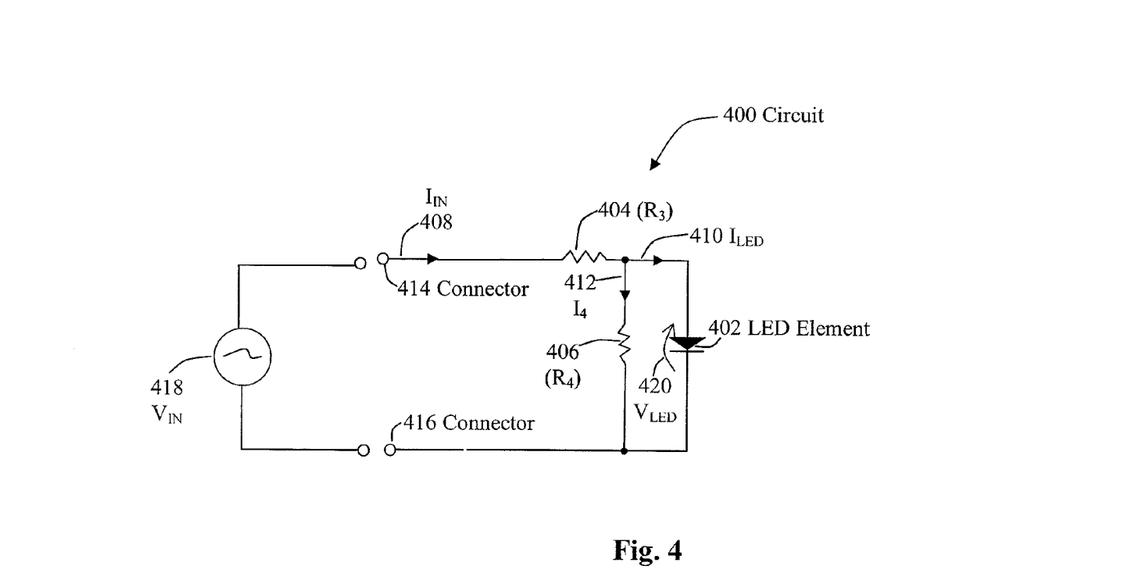
FIG. 4 is a schematic diagram of another embodiment of a circuit for an interchangeable LED lamp.

FIG. 4 is a schematic diagram of another embodiment of a circuit 400 for an interchangeable LED lamp. As shown in FIG. 4, an input voltage 418 is applied to connectors 414, 416 of the circuit 400. This creates an input current 408 that is applied to resistor 404 ($R_3$) of the circuit 400. The input current 408 is split between $I_{LED}$ current 410 that is applied to LED element 402 and $I_4$ current 412 that is applied to resistor 406 ($R_4$).

The values of resistors 404 ($R_3$) and 406 ($R_4$) are determined by the following equations:

$$V_{LED} = (I_{in} - I_{LED})R_4 \quad (7)$$

and $$V_{in} = V_{LED} + I_{in}R_3 \quad (8)$$

Solving the above equations (7) and (8), $$R_3 = \frac{V_{in} - V_{LED}}{I_{in}} \text{ and} \quad (9)$$

$$R_4 = \frac{V_{LED}}{I_{in} - I_{LED}} \quad (10)$$

In the same manner as the embodiment of FIG. 1, $V_{in} \geq V_{LED}$ and $I_{in} \geq I_{LED}$. $R_3$ can be zero when $V_{in} = V_{LED}$. $R_4$ can be infinite when $I_{in} = I_{LED}$. Again, by standardizing and making the input impedance $R_{in}$ the same for each of the LED bulbs that is in the LED string, LED bulbs can be interchangeably inserted in sockets in the LED string without affecting the operation of the LED string. Hence, bulbs of different colors and types can be used interchangeably without causing the LED string to either dim or cause the LED bulbs in the LED string to have a shortened lifetime. Again, a series connector resistor (not shown) in the LED string can make up the differences in the voltage drop required on the string based upon the number of LED bulbs in the string and the manner in which the LED bulbs are connected to the string.

Figure 5:
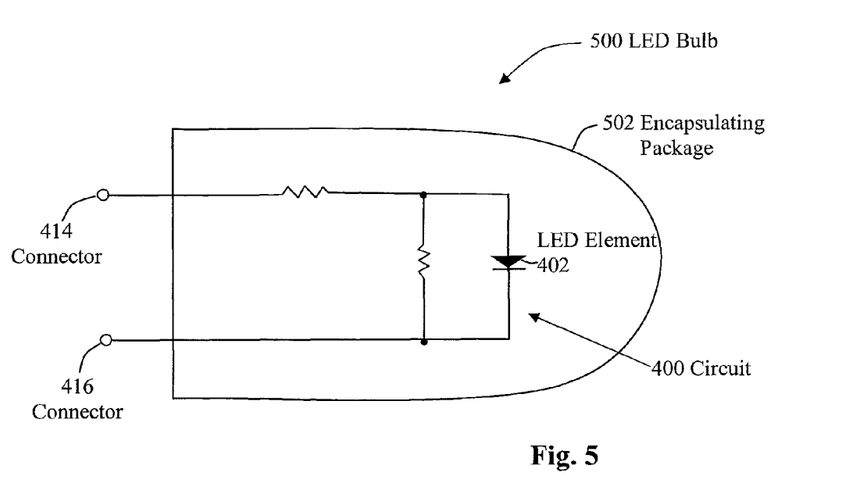
FIG. 5 is an illustration of the circuit of the embodiment of FIG. 4 disposed in an encapsulating package.

FIG. 5 is an illustration of an embodiment of an LED bulb 500 that utilizes the circuit 400 illustrated in FIG. 4. As shown in FIG. 5, the circuit 400 is disposed in an encapsulating package 502 which may comprise an epoxy material or other material, such as plastic. The epoxy material is transparent so that optical waves generated by the LED element 402 are transmitted through the encapsulating package 502. Connectors 414, 416 protrude from the encapsulating package 502 and may comprise LED bulb leads.

Figure 6:
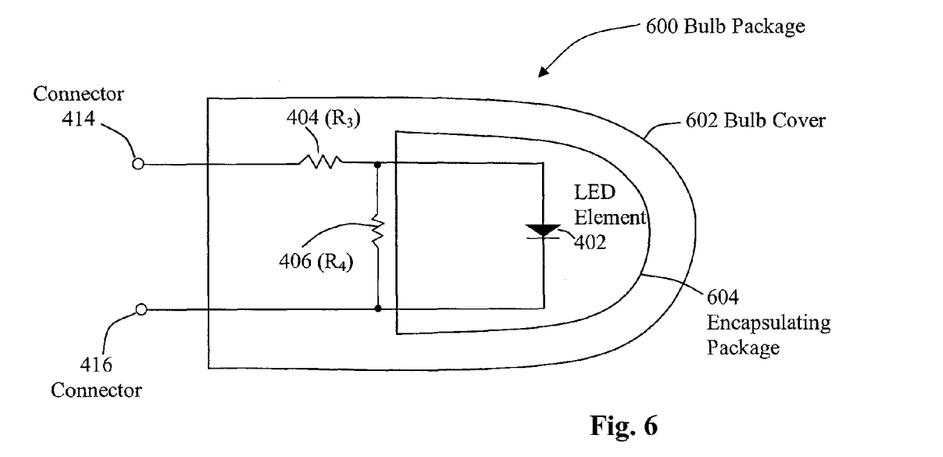
FIG. 6 is an illustration of the circuit of FIG. 4 showing an alternative packaging configuration.

FIG. 6 is an illustration of another embodiment of a bulb package 600. As illustrated in FIG. 6, the bulb package 600 includes a bulb cover 602 that covers the resistors 404, 406 as well as encapsulating package 604. Encapsulating package 604 contains the LED element 402. If the LED element 402 is prepackaged in an encapsulating package 604, the resistors 404, 406 can be connected as shown to the encapsulating package 604 and packaged in the bulb package 600 to provide a standardized LED bulb that can be used interchangeably in an LED light string.

Hence, the embodiments provide LED bulbs that have a standardized preset input impedance, operating voltage and current. When used for an LED string, the standardization allows LED elements having different colors, different construction to be replaced without affecting the operation of the LED string, such as causing dimming or the over application of current to other bulbs in the string. Further, the circuits used in the disclosed embodiments allow the LED elements to be optimized with respect to brightness and longevity so that the LED elements operate under optimal operating parameters. Further, the resistors that are connected in parallel to the LED elements, i.e. resistors 106, 406, function as bypass elements so that if an LED element burns open, current will bypass the LED element so that a series connected string of LED bulbs will continue to operate. In that way, the burned out bulb will be easy to locate since the other bulbs in the string will still be lighted. The burned out bulbs can then be easily replaced and not affect the overall operation of the string. Replacement bulbs can also be any desired color. As such, the need for parallel LED bulbs to prevent a series wired LED string from going dark, if one of the bulbs burns out, is eliminated. All of the economies of providing a series wired LED string can be realized utilizing the embodiments disclosed, while allowing burned out bulbs to be easily detected and replaced without affecting the light string. When used for other illumination purposes, for example, room light, the bulbs are interchangeable because they have the same operating voltage and current.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An interchangeable LED bulb having a standardized input impedance that is based upon an input current ($I_{in}$) and an input voltage ($V_{in}$) applied to said interchangeable LED bulb when said interchangeable LED bulb that is disposed in an LED light string without substantially affecting performance and luminosity of said light string comprising:

an LED element having an operating voltage ($V_{LED}$) that is applied across said LED element and an operating current ($I_{LED}$) that flows through said LED element when said interchangeable LED bulb is placed in said LED light string;

a first resistor that is connected in series said LED element having a resistive value that is approximately equal to $(V_{in}-V_{LED})/I_{LED}$ a second resistor that is connected in parallel with said first resistor and said LED element having a resistive value that is approximately equal to $(V_{in}/(I_{in}-I_{LED})$ said first resistor and said second resistor being selected to have resistive values so that said LED element has a substantially predetermined luminosity and said interchangeable LED bulb has an input impedance that is substantially equal to said standardized input impedance so that said LED light string maintains a substantially uniform luminosity in said LED light string.

2. The interchangeable bulb of claim 1 wherein said operating voltage $V_{LED}$ and said operating current $I_{LED}$ are substantially optimal for providing both longevity and brightness of said LED element.

3. The interchangeable bulb of claim 1 wherein a power source for said LED light string is an alternating current.

4. The interchangeable bulb of claim 1 wherein a power source for said LED light string is a direct current.

5. The interchangeable bulb of claim 1 wherein said operating voltage $V_{LED}$ and said operating current $I_{LED}$ are substantially optimal for providing both longevity and brightness of said LED element.

6. The interchangeable bulb of claim 5 wherein:
$I_{in} \geq I_{LED}$; and
$V_{in} \geq V_{LED}$.

7. The interchangeable bulb of claim 6 wherein:
$I_{in} \geq I_{LED}$; and
$V_{in} \geq V_{LED}$.

8. The interchangeable bulb of claim 7 further comprising:
an epoxy encapsulating package that is disposed around said LED element, said first resistor and said second resistor.

9. The interchangeable bulb of claim 7 further comprising:
an epoxy encapsulating package that is disposed around said LED element, said first resistor and said second resistor.

10. A method of making an interchangeable LED bulb for an LED light string, said interchangeable LED bulb having a first resistor, a second resistor and an LED element, comprising:

selecting a standardized input impedance for said interchangeable LED bulb that is substantially equal to input impedances of other LED bulbs in said LED light string, by determining an input voltage ($V_{in}$) and an input current ($I_{in}$) to be applied to said interchangeable LED bulb when said interchangeable LED bulb is inserted in said LED light string;

selecting an operating current ($I_{LED}$) and an operating voltage ($V_{LED}$) for said LED element of said interchangeable LED bulb to create a substantially predetermined luminosity of said LED elements;

connecting a first resistor in series with said LED element;

connecting a second resistor in series with said first resistor and said second resistor in parallel with said LED element;

selecting resistive values for said first resistor and said second resistor so that said LED element creates said substantially predetermined luminosity and said interchangeable LED bulb has an input impedance that is substantially equal to said standardized input impedance.

11. The method of claim 10 wherein a power source for said LED light string is an alternating current.

12. The method of claim 10 wherein a power source for said LED light string is a direct current.

13. The method of claim 10 further comprising:
selecting a substantially optimal operating current and a substantially optimal operating voltage ($V_{LED}$) for said LED element to provide adequate brightness and a prolonged lifetime for said LED element.

14. The method of claim 13 where said method of selecting a standardized input impedance by determining an input voltage ($V_{in}$) and an input current ($I_{in}$) comprises:
selecting an input current ($I_{in}$) as follows: $I_{in} \geq I_{LED}$;
selecting an input voltage ($V_{in}$) as follows: $V_{in} \geq V_{LED}$.

15. The method of claim 14 further comprising:
encapsulating said LED element, said first resistor and said second resistor in epoxy.

16. An interchangeable LED bulb having a standardized input impedance that is substantially equal to input impedances of other LED bulbs in an LED light string, said standardized input impedance being based upon an input current ($I_{in}$) and an input voltage ($V_{in}$) that is applied to said interchangeable LED bulb when said interchangeable LED bulb is disposed in an LED light string comprising:

an LED element that forms a part of said interchangeable LED bulb having an operating voltage $V_{LED}$ that is applied across said LED and an operating current $I_{LED}$ that flows through said LED element when said interchangeable LED bulb is placed in said LED light string;

a first resistor that forms a part of said interchangeable LED bulb, that is connected in series with said LED element having a resistive value that is approximately equal to $V_{LED}/(I_{in}-I_{LED})$;

a second resistor that forms a part of said interchangeable LED bulb, that is connected in parallel with said first resistor and said LED element having a resistive value that is approximately equal to $(V_{in}-V_{LED})I_n$, wherein said first resistor and said second resistor are selected to have resistive values so that said LED element creates a luminosity that is substantially the same as other LED elements in said LED light string, and said interchangeable LED bulb has an input impedance that is substantially equal to said standardized input impedance so that a substantially uniform luminosity is created from said interchangeable LED bulb and said other LED bulbs in said LED light string.

17. The interchangeable bulb of claim 16 wherein said operating voltage $V_{LED}$ and said operating current $I_{LED}$ are substantially optimal for providing both longevity and brightness of said LED element.

18. The interchangeable bulb of claim 16 wherein a power source for said LED light string is an alternating current.

19. The interchangeable bulb of claim 16 wherein a power source for said LED light string is a direct current.

20. The interchangeable bulb of claim 16 wherein:
$I_{in} \geq I_{LED}$; and
$V_{in} \geq V_{LED}$.

21. The interchangeable bulb of claim 20 further comprising:
an epoxy encapsulating package that is disposed around said LED element, said first resistor and said second resistor.

22. The interchangeable bulb of claim 20 further comprising:
an epoxy encapsulating package that is disposed around said LED element, said first resistor and said second resistor.

* * * * *